United States Patent
Brabec et al.

(10) Patent No.: US 7,407,831 B2
(45) Date of Patent: Aug. 5, 2008

(54) METHOD FOR PRODUCING ORGANIC SOLAR CELLS OR PHOTO DETECTORS

(75) Inventors: Christoph Brabec, Linz (AT); Schilinsky Pavel, Nuremberg (DE)

(73) Assignee: Konarka Technologies, Inc., Lowell, MA (US)

( * ) Notice: Subject to any disclaimer, the term of this patent is extended or adjusted under 35 U.S.C. 154(b) by 22 days.

(21) Appl. No.: 10/561,582

(22) PCT Filed: Jun. 30, 2004

(86) PCT No.: PCT/EP2004/007122

§ 371 (c)(1), (2), (4) Date: Mar. 7, 2006

(87) PCT Pub. No.: WO2005/004252

PCT Pub. Date: Jan. 13, 2005

(65) Prior Publication Data

US 2007/0092988 A1    Apr. 26, 2007

(30) Foreign Application Priority Data

Jul. 1, 2003    (DE)    ................. 103 29 654

(51) Int. Cl.
H01L 51/40    (2006.01)
(52) U.S. Cl. ............... 438/99; 438/94; 136/263; 257/E21.007
(58) Field of Classification Search ............ 438/82, 438/99, 57, 93, 94; 136/263, 243
See application file for complete search history.

(56) References Cited

U.S. PATENT DOCUMENTS 5,454,880 A * 10/1995 Sariciftci et al. ............. 136/263
5,670,791 A * 9/1997 Halls et al. ................... 257/40
5,747,363 A * 5/1998 Wei et al. ..................... 438/5
6,340,789 B1 * 1/2002 Petritsch et al. ............. 136/263
6,812,399 B2    11/2004 Shaheen et al.

(Continued)

FOREIGN PATENT DOCUMENTS

JP    2004 165474    6/2004

(Continued)

OTHER PUBLICATIONS

Brabec et al., "Photovoltaic properties of conjugated polymer/methanofullerene composites embedded in a polystyrene matrix.", May 1, 1999, Journal of Applied Physics, vol. 85, No. 9, pp. 6866-6872.*

(Continued)

Primary Examiner—Scott B. Geyer
Assistant Examiner—Reema Patel
(74) Attorney, Agent, or Firm—Fish & Richardson P.C.

(57) ABSTRACT

A method for the production of organic solar cells or photodetectors, particularly based on organic polymers, comprising the following steps:—a first organic n- or p-conductive semiconductor layer is applied to an electrode, to the solid first organic semiconductor layer is applied a second organic semiconductor layer of the respective other conductivity whose solvent partially dissolves the first organic semiconductor layer, such that the first semiconductor layer mixes with the second mixed layer;—a second electrode is applied opposite the first.

11 Claims, 1 Drawing Sheet

U.S. PATENT DOCUMENTS

| | | |
|---|---|---|
| 6,933,436 B2 | 8/2005 | Shaheen et al. |
| 2004/0233502 A1 | 11/2004 | Brabec et al. |
| 2006/0011233 A1 | 1/2006 | Sariciftci et al. |
| 2006/0107996 A1 | 5/2006 | Shaheen et al. |

FOREIGN PATENT DOCUMENTS

| | | |
|---|---|---|
| WO | WO 01/47044 | 6/2001 |
| WO | WO 01/59854 | 8/2001 |
| WO | 01/84644 | 11/2001 |
| WO | 01/86734 | 11/2001 |
| WO | WO 01/84645 | 11/2001 |
| WO | 03/015189 | 2/2003 |
| WO | 03/098715 | 11/2003 |

OTHER PUBLICATIONS

Gebeyehu et al., "Photovoltaic properties of conjugated polymer/fullerene composites on large area flexible substrates." 2000, Chemcial Society of Ethiopia, vol. 14, No. 1, pp. 57-68.*

Shaheen et al., "2.5% efficient organic plastic solar cells", *Applied Physics Letters*, AIP, American Institute of Physics, Melville, NY, vol. 78, No. 6, Feb. 5, 2001.

Brabec et al., "Plastic solar cells", *Advanced Functional Materials*, 2001, 11, No. 1, Feb.

Brabec et al., "The influence of materials work function on the open circuit voltage of plastic solar cells", *Thin Solid Films*, Elsevier Sequoia, NL, vol. 403-404 (2002), 368-372.

Winder et al., "Sensitization of low bandgap polymer bulk heterojunction solar cells", *Thin Solid Films*, Elsevier Sequoia, NL, vol. 403-404 (2002), 373-379.

Loos et al. "The use of the focused ion bean technique to prepare cross-sectional transmission electron microscopy specimen of polymer solar cells deposited on glass", *Polymer*, Elsevier Science Publishers B.V., GB, vol. 43, No. 26, Dec. 2002.

Manca et al. "State-of-the-art MIDMO-PPV:PCBM bulk heterojunction organic solar cells: materials, nano-morphology and electro-optical properties", Proceedings of the SPIE "Organic Photovoltaics III", SPIE, Bellingham, VA, vol. 4801, No. 11, Jul. 2002.

Cravino et al, "Conjugated polymer/fullerene based organic solar cells", Contribution for the Proceedings for the European Meeting on High Efficiency Solar Cells, Ispra, Italy, Nov. 15-16, 2001.

* cited by examiner

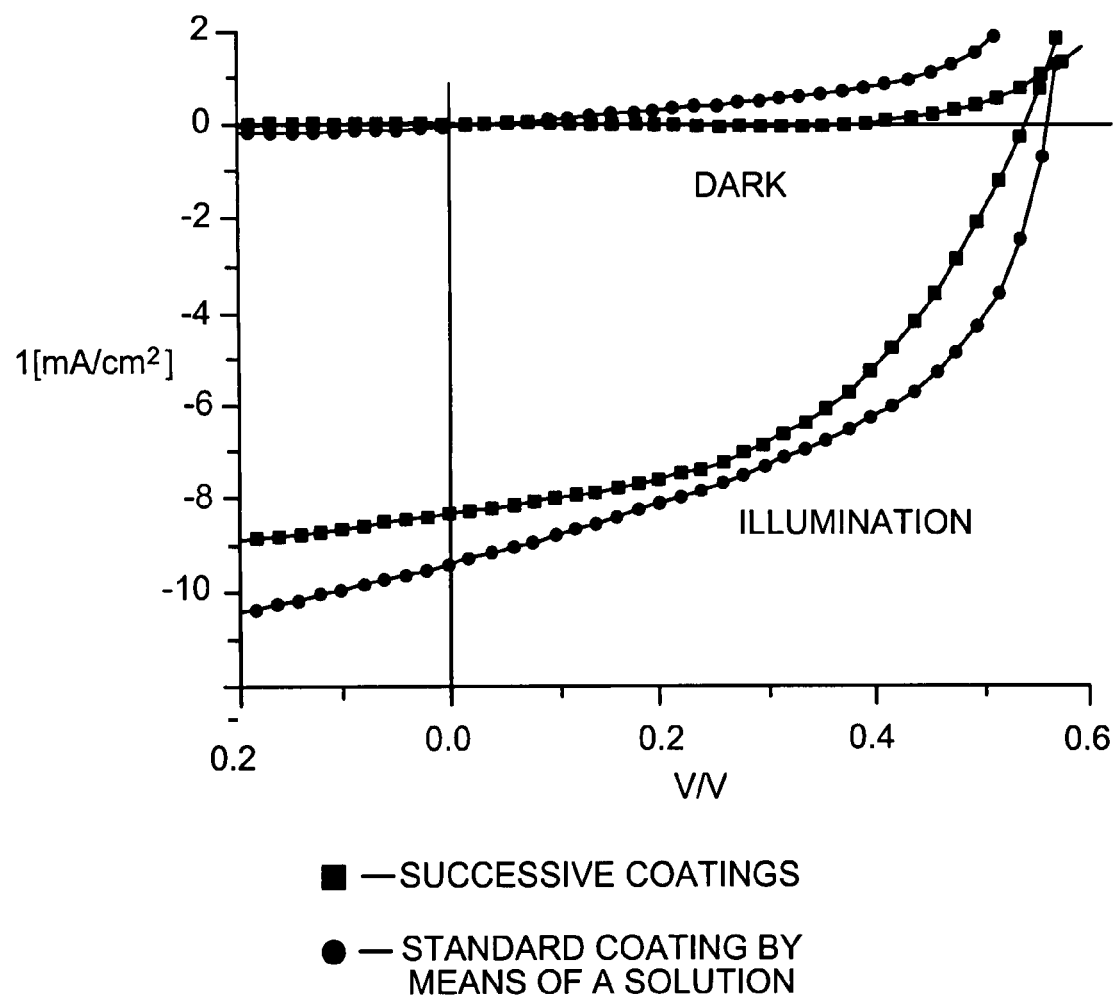

METHOD FOR PRODUCING ORGANIC SOLAR CELLS OR PHOTO DETECTORS

CROSS-REFERENCE TO RELATED APPLICATIONS

This application claims priority under 35 U.S.C. §371 to international application number PCT/EP2004/007122, filed Jun. 30, 2004, which in turn claims priority to German application number 103 29 654.9, filed Jul. 1, 2003. These applications are herein incorporated by reference.

FIELD OF THE INVENTION

The invention concerns the production of organic solar cells, particularly of polymer-based construction.

BACKGROUND

The typical cell structure of a solar cell is comprised of a layer structure that includes a positive electrode, a mixture of organic semiconductors and a negative electrode. The material used for the positive electrode can, for example, be ITO/PEDOT:PSS. The semiconductor mixture is composed of an organic material, for example a polymer. The semiconductor mixture includes both n-conductive and p-conductive semiconductor molecules. This mixed semiconductor layer is known as a bulk heterojunction layer. Additional materials that are used concern the negative electrode, for example, which can be made of Ca/Ag or LiF/Al. The above-listed substances do not, however, exclusively constitute the elements concerned, but rather, other material combinations are also feasible. The donor present in the bulk mixed layer can for example be a conjugated polymer, and the acceptor can for example be a soluble methanofullerene.

A major difficulty in the production of bulk heterojunction solar cells is to create a desirable phase morphology with respect to the n-semiconductor and the p-semiconductor. This problem is due, among other things, to the different solubility of the individual components in the common solvent.

Attempts have heretofore been made to obtain the desired morphology using only one solvent, which dissolves the organic semiconductors used in a way that permits the fabrication of suitably thick and homogeneous, well-blended semiconductor films.

The choice of solvents is very limited, owing to the particularly high requirements imposed on them. For example, it is desirable for the formation of a concentration gradient in the distribution of the semiconductors in the so-called bulk to be accompanied by a suitable morphology for the semiconductor mixture in the applied film. The choice of solvent is also particularly limited, for example, by phase separation within the range of the exciton diffusion length [1].

Alternatively, geometries created by the successive application of the individual semiconductor layers have heretofore been investigated. Such attempts have included the use of a so-called bilayer with a sharp interface between the two semiconductors [2]. A "stratified multilayer" has also been developed [3]. This involves the formation of interdiffusion layers in which the upper layer is able to penetrate slightly into the lower layer. This leads to partial interleaving or mixing by diffusion.

SUMMARY OF THE INVENTION

The object of the invention is to specify a production method for an organic solar cell by means of which a bulk heterojunction mixed layer can be formed.

This object is achieved by means of the combination of features specified in Claim 1. Advantageous configurations can be found in the dependent claims.

The invention is based on the knowledge that a bulk heterojunction mixed layer can be produced by the serial application of solutions each of which contains only one organic semiconductor. The phase morphology of the n- and p-semiconductors is the prime consideration. To produce the desired morphology, and particularly to create the bulk heterojunction, the phase configuration must be closely controlled during the deposition and solidification periods.

A major contribution of the invention is the technologically simpler production of a bulk heterojunction cell. Although two serially applied layers are provided, the overall result is greater freedom in the choice of solvent, associated with substantial advantages for production as a whole. If the layer forming the heterojunction is fabricated as a bulk, then thorough mixing of the n-semiconductor and the p-semiconductor is present. Such fabrication is possible based on the invention because a bulk heterojunction is produced by the application of two serial layers, while at the same time, in the deposition process for each individual layer, the semiconductor materials contained in that layer can be ideally matched to the corresponding solvents. This creates the aforesaid utmost freedom in solution-forming. An essential factor is very slight dissolution of the first layer when the second layer is applied to the first. The first semiconductor layer therefore mixes at least partially with the second semiconductor layer.

Exemplary embodiments that are not limitative of the invention will be described specifically below:

BRIEF DESCRIPTION OF THE FIGURE

FIG. 1 compares the characteristic curves of solar cells produced respectively according to the prior art and according to the invention.

DETAILED DESCRIPTION

The curves illustrated in the FIGURE pertain to, on the one hand, depicted with solid circles, a solar cell produced by standard spin-coating in which both the n-semiconductor and the p-semiconductor are dissolved in a solution. The curves depicted with solid squares relate to a solar cell produced by the serial application of layers, in which the respective solutions used to produce each layer contain either an n-semiconductor alone or a corresponding p-semiconductor. The characteristic curves according to the prior art and according to the invention do not differ substantially, whether recorded in the dark or under illumination.

The major advantages of the invention reside in the great freedom provided with respect to solvent formulation.

The fabrication of an organic solar cell with a bulk heterojunction mixed layer can proceed for example as follows: An organic semiconductor is first applied to a carrier substrate, for example glass, ITO/PEDOT:PSS. This is done for example by spin-coating, doctor-blading or printing.

Particularly advantageously, the choice of the first solvent can be matched to the solubility of the first semiconductor. The first semiconductor is, for example, P3HT, PPV. The formulation of the second solution is also optimized with respect to the solubility of the second semiconductor. The second semiconductor is for example a fullerene. The first semiconductor or first semiconductor layer must, however, be slightly soluble in the solvent used for processing the second semiconductor layer. When the second solution is applied to the first layer, which is also performed by an additive application method such as doctor-blading or printing, the first semiconductor dissolves slightly and mixes with the second semiconductor. After the solvent has been evaporated, a bulk heterojunction mixed layer has formed as a result of the mixing of the very thin respective layers. In this way an ideal phase morphology can be obtained for each semiconductor, while at the same time achieving thorough intermixing.

REFERENCES

[1] Brabec, C. J., N. S. Sariciftci and J. C. Hummelen, "Plastic solar cells," *Advanced Functional Materials* 11/1 (2001), 15-26.
[2] Brabec et al., *Thin Solid Films* 403-404 (2002), 368-372.
[3] Shaheen, S. E., C. J. Brabec, N. S. Scariciftci, F. Padinger, T. Fromherz and J. C. Hummelen, "2.5% efficient organic plastic solar cells," *Applied Physics Letters* 78/6 (2001), 841-3.

What is claimed is:

1. A method for the production of organic solar cells or photodetectors, the method comprising:
   applying a first organic n- or p-conductive semiconductor layer to a first electrode, the first organic semiconductor layer having a first conductivity,
   applying a second organic semiconductor layer to the first organic semiconductor layer, the second organic semiconductor layer having a second conductivity opposite to the first conductivity, the second organic semiconductor being present in a solvent when applied to the first organic semiconductor layer, the solvent being capable of partially dissolving the first organic semiconductor layer, such that a portion of the first semiconductor mixes with a portion of the second semiconductor to form a bulk heterojunction mixed layer, and
   after applying the second organic semiconductor layer to the first organic semiconductor layer, applying a second electrode opposite the first electrode.

2. The method according to claim 1, wherein the solvent for each of the first and second organic semiconductor layers is matched to the solubility of the semiconductor to be deposited in that layer.

3. The method according to claim 1, wherein the application of the first or second organic semiconductor layer is effected by doctor-blading or by a printing process.

4. The method according to claim 1, wherein a conjugated polymer is used as a donor.

5. The method according to claim 1, wherein a soluble methanofullerene is used as an acceptor.

6. A method for producing organic solar cells or photodetectors, the method comprising:
   applying a solution comprising a second organic semiconductor and a solvent on a first layer, the first layer comprising a first organic semiconductor that is at least partially soluble in the solvent;
   evaporating the solvent to form a second layer and a bulk heterojunction mixed layer between the first and second layers, the second layer comprising the second organic semiconductor and the bulk heterojunction mixed layer comprising a mixture of the first and second organic semiconductors; and
   disposing a second electrode on the second layer after evaporating the solvent.

7. The method of claim 6, further comprising disposing the first layer on a first electrode before applying the solution.

8. The method of claim 6, wherein the solution is applied by spin-coating, doctor-blading, or by a printing process.

9. The method of claim 6, wherein the first organic semiconductor is a conjugated polymer.

10. The method of claim 6, wherein the second organic semiconductor is a fullerene.

11. The method of claim 10, wherein the fullerene is a methanofullerene.

* * * * *

UNITED STATES PATENT AND TRADEMARK OFFICE
CERTIFICATE OF CORRECTION

PATENT NO. : 7,407,831 B2 Page 1 of 1
APPLICATION NO. : 10/561582
DATED : August 5, 2008
INVENTOR(S) : Christoph Brabec It is certified that error appears in the above-identified patent and that said Letters Patent is hereby corrected as shown below:

Title Page, Column 1 Item [54]
Line 2, delete "PHOTO DETECTORS" and insert -- PHOTODETECTORS --.

Title Page, Column 1 Item [56]
Foreign Application Priority Data
Line 1, after "103 29 654" insert -- .9 --.

Column 1
Line 2, delete "PHOTO DETECTORS" and insert -- PHOTODETECTORS --.

Signed and Sealed this

Fourth Day of November, 2008

JON W. DUDAS
*Director of the United States Patent and Trademark Office*